US006263083B1

(12) United States Patent
Weinreich

(10) Patent No.: US 6,263,083 B1
(45) Date of Patent: Jul. 17, 2001

(54) DIRECTIONAL TONE COLOR LOUDSPEAKER

(75) Inventor: Gabriel Weinreich, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 08/837,297

(22) Filed: Apr. 11, 1997

(51) Int. Cl.[7] .......... H03G 5/00
(52) U.S. Cl. .......... 381/97; 381/98
(58) Field of Search .......... 381/300, 303, 381/304, 98, 99, 97, 160, 63

(56) References Cited

U.S. PATENT DOCUMENTS

| | | | |
|---|---|---|---|
| 1,825,166 | 9/1931 | Sullivan . | |
| 3,672,463 | 6/1972 | Jaffe et al. . | |
| 3,777,844 | 12/1973 | Johnson . | |
| 3,945,461 | 3/1976 | Robinson . | |
| 3,993,162 | 11/1976 | Juuti . | |
| 4,131,179 | 12/1978 | Pope . | |
| 4,142,603 | 3/1979 | Johnson . | |
| 4,176,730 | 12/1979 | Mushkin . | |
| 4,276,446 | 6/1981 | Taddeo . | |
| 4,349,697 * | 9/1982 | Skabla | 381/99 |
| 4,553,628 | 11/1985 | Nakamura . | |
| 4,655,315 | 4/1987 | Saville . | |
| 4,819,761 | 4/1989 | Dick . | |
| 4,942,939 | 7/1990 | Harrison . | |
| 5,060,270 * | 10/1991 | Shinoda | 381/63 |
| 5,092,424 | 3/1992 | Schreiber et al. . | |
| 5,173,575 | 12/1992 | Furukawa . | |
| 5,197,103 | 3/1993 | Hayakawa . | |
| 5,206,465 | 4/1993 | Jung . | |
| 5,296,656 | 3/1994 | Jung . | |
| 5,313,525 | 5/1994 | Klasco . | |
| 5,406,637 | 4/1995 | Gonzalez . | |
| 5,436,977 | 7/1995 | Sato . | |
| 5,450,495 | 9/1995 | Goldfarb . | |
| 5,479,520 * | 12/1995 | Nieuwendijk | 381/160 |
| 5,512,715 | 4/1996 | Takewa et al. . | |
| 5,514,841 | 5/1996 | Rochon . | |
| 5,517,573 | 5/1996 | Polk et al. . | |
| 5,524,062 | 6/1996 | Oh . | |

FOREIGN PATENT DOCUMENTS

| | | | |
|---|---|---|---|
| 59-23997 * | 2/1984 | (JP) | 381/99 |

* cited by examiner

*Primary Examiner*—Minsun Oh Harvey
(74) *Attorney, Agent, or Firm*—Harness, Dickey & Pierce, P.L.C.

(57) ABSTRACT

The present invention simulates complex radiation patterns or directivity patterns of musical instruments, resulting in a surprising realism. The invention employs a plurality of sound sources disposed in close proximity to one another. The individual sound sources each provide a different signal delay resulting in constructive and destructive interference of the sound waves generated.

18 Claims, 7 Drawing Sheets

DIRECTIONAL TONE COLOR LOUDSPEAKER

The invention described herein was made with government support under contract PHY9319567 awarded by the National Science Foundation. The government has certain rights in the invention.

BACKGROUND OF THE INVENTION

1. Field of the Invention

The present invention relates generally to audio loudspeakers. More particularly, the invention relates to a loudspeaker system that simulates the complex directional radiation patterns of sound. The directional radiation patterns, a strong function of both spacial position and frequency, produce the psychoacoustic illusion that the reproduced sound comes from the original musical instrument source.

2. Description of Related Art

Pierre Boulez has observed that loudspeakers have the property of "anonymizing" the sound of musical instruments, that is, of making them all sound the same. "*Le haut-parleur anonymise la source réelle.*" P. Boulez, Proc. 11th International Congress on Acoustics, Paris, 8, 216 (1983). Considerable effort has been expended in improving the sonic accuracy of loudspeakers and in developing stereophonic and surround sound techniques in an effort to simulate the psychoacoustic experience of "being there." Yet the objective remains elusive. The loudspeaker art has not heretofore addressed the unfortunate anonymizing property observed by Boulez.

I have discovered that the complex and widely varied radiation patterns of musical instruments provide a strong psychoacoustic cue and that the simulation of such complex radiation patterns produces a surprising realism not found in conventional loudspeaker systems. I use the solo violin to demonstrate.

Above about one kHz, the angular radiation pattern of a violin begins to vary rapidly, not only with direction but also with frequency, typically changing drastically from one semitone to the next. In an enclosed space, this characteristic, which I call directional tone color, can produce the illusion that each note played by a solo violin comes from a different direction, endowing fast passages with a special flashing brilliance. Directional tone color also has important consequences for the perception of vibrato, for the difference in sound between a solo violin and an orchestral section playing in unison, for the mysterious quality called "projection," and for the problem of reproducing violin sounds through a loudspeaker. Furthermore, directional tone color is important for the reproduction of extended sound sources which generate different notes from different locations, such as a pipe organ or an orchestra.

The present invention simulates complex radiation patterns or directivity patterns of musical instruments, resulting in a surprising realism. The invention employs plural radiators or transducers, such as individual loudspeakers, disposed in proximity to one another and individually fed by separate sound sources. More specifically, the individual sound sources each provide a different signal delay, so that the individual speakers receive the input audio signal at slightly different times. In the preferred embodiment these sound sources also incorporate attenuated feedback, so that each speaker receives the audio input signal as a decaying reverberant signal. The preferred embodiment also includes a low frequency radiator or woofer that is supplied through a low pass filter without delay.

The inter-speaker spacing and the delay times cooperate to produce a complex angular radiation pattern that varies rapidly with both direction and frequency. The individual radiators each establish individual sound fields that interact constructively and destructively to produce the complex, time-varying radiation pattern. The listener, even a stationary listener, will perceive these rapidly varying radiation patterns, due to the frequency variation of the source material and due to acoustic reflections from surrounding walls and furniture. Unlike conventional stereophonic or surround sound systems, the individual radiators are not widely separated to produce the realistic effect. Indeed, even a single speaker enclosure housing the plural radiators of the invention will produce a three-dimensional realism. Unlike conventional stereophonic or surround sound systems, there is no single "sweet spot" where the effect is most convincing. Rather, listeners can perceive the effect from virtually any position within the room. For a more complete understanding of the invention, its objects and advantages, reference may be had to the following specification and to the accompanying drawings.

SUMMARY OF THE INVENTION

A Directional Tone Color Loudspeaker is provided which simulates a complex audio radiation pattern. The Loudspeaker has a plurality of electroacoustic transducers disposed in proximity to one another and a plurality of signal modification devices which receive an audio signal and produce a plurality of modified signals having varying phase delays. The modified signals are provided to the plurality of electroacoustic transducers which generate a plurality of sound waves that constructively and destructively interact to simulate the complex audio radiation pattern.

BRIEF DESCRIPTION OF THE DRAWINGS

Other objects and advantages of the invention will become apparent upon reading the following detailed description and upon reference to the following drawings, in which.

DESCRIPTION OF THE PREFERRED EMBODIMENTS

The following description of the preferred embodiments is merely exemplary in nature and is in no way intended to limit the invention or its application or uses.

It has been observed that loudspeakers have the property of anonymizing the sound of musical instruments, that is, making them all sound the same. Given the high objective specifications met by modern loudspeakers, it is hard to put physical meaning to such a statement in terms of qualities such as frequency response or distortion. Yet, there is one limiting attribute of a loudspeaker which is imposed upon all sounds that are generated by it, and that is the loudspeaker's own directivity.

The damage cause by this directivity is not excessively serious for wind instruments, and especially for the brasses, whose live sound is projected through a circular bell of a size not too radically different from that of a typical loudspeaker. As a result, the directional properties of this sound, essentially those of a circular piston of comparable diameter, remain relatively faithful. Furthermore, if an instrument has a sound radiation pattern which varies only slowly with direction and more or less continuously with frequency, the perception of that pattern is obscured by the many complex reflections produced in a normal reverberant room. For this reason, there would be little point in an elaborate electronic or acoustic system to duplicate the directional properties of such an instrument. However, when the instrument's own radiation pattern varies rapidly both with direction and with frequency, as is the case with a violin, directional characteristics are clearly perceptible.

As previously indicated, the angular radiation pattern of some instruments, like the violin, begin to vary rapidly with direction, and also with frequency, typically changing drastically from one semitone to the next. In an enclosed space, the presence of large and closely spaced variations in the instruments directivity, i.e. directional tone color, produces the illusion that each note played comes from a different direction, endowing fast passages with a special flashing brilliance. This effect also exists for extended sound sources which actually do generate different notes from different directions, like pipe organs or an orchestra. The theoretical basis for directional tone color, data to support its existence, and an additional discussion of ways in which this effect is musically important, is subsequently presented under the heading of Theory and Experimental Results. Needless to say, sounds produced by conventional loudspeakers lack directional tone color, resulting in sound which is similar to what would be heard if an instrument were played on the other side of a solid wall having a circular hole the size of the speaker cut into it.

Figure 2:
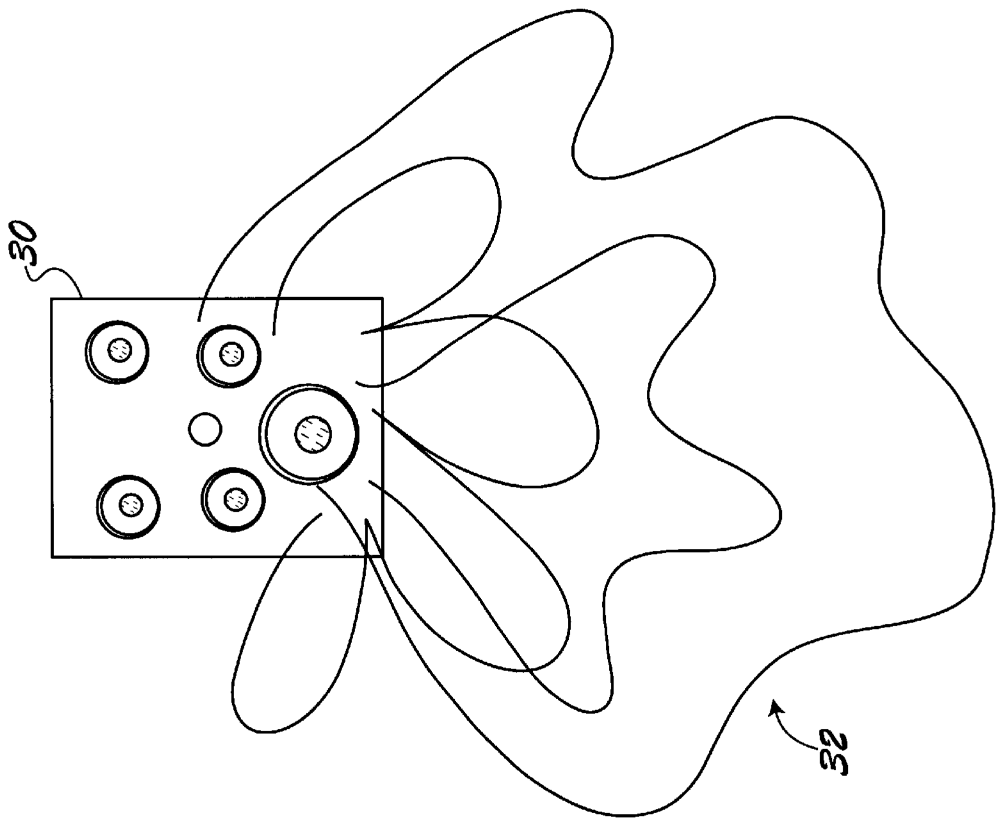
FIG. 2 is a simplified illustration of a sound pattern generated by a directional tone color loudspeaker in order to simulate the sound pattern produced by the violin of FIG. 1.
Figure 1:
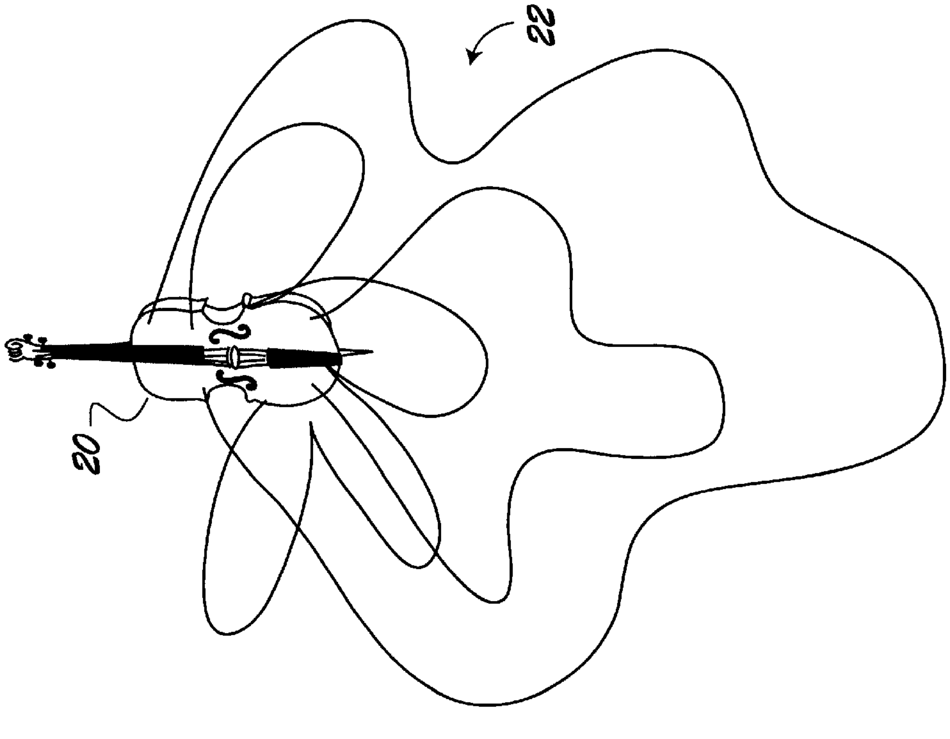
FIG. 1 is a simplified illustration of a sound pattern produced by a violin.

The directional tone color loudspeaker of the present invention has the essential purpose of controlling the angular pattern in which a loudspeaker emits sound by using concepts similar to phase array antenna theory. Therefore, if as shown in FIG. 1, a violin 20 produces a sound field pattern 22, the directional tone color loudspeaker 30 is intended to simulate a complex sound field pattern 32, as illustrated in FIG. 2.

Figure 3:
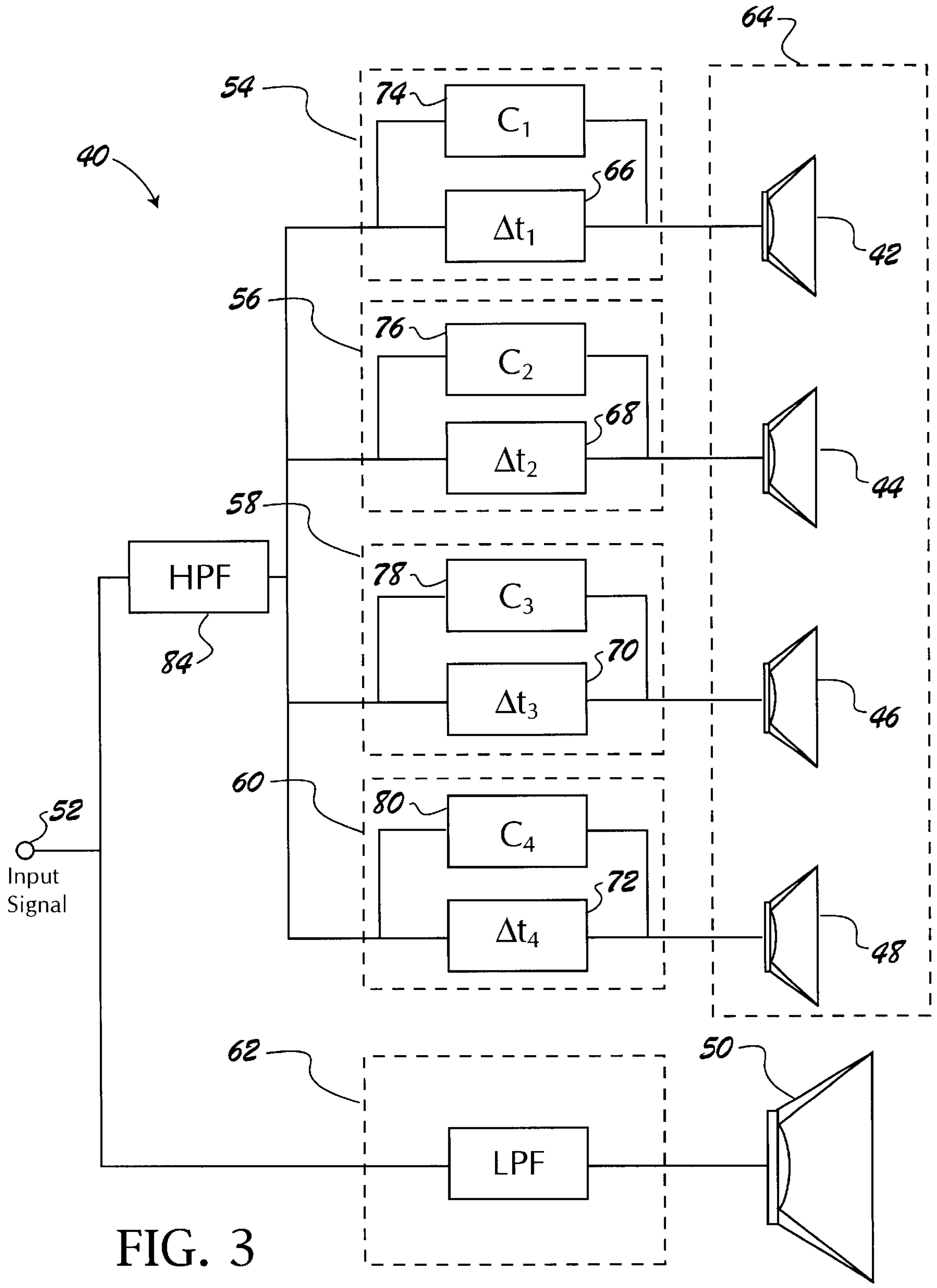
FIG. 3 is a schematic of a directional tone color loudspeaker of the preferred embodiment of the present invention.

FIG. 3 illustrates a preferred embodiment of the directional tone color loudspeaker system 40. The Loudspeaker system 40 has five electroacoustic transducers (42, 44, 46, 48). These transducers (42, 44, 46, 48) are driven by a single input signal 52 that is modified in five different ways by five modification branches (54, 56, 58, 60, 62). Four of these transducers (42, 44, 46, 48) form the directional tone color component 64 of the loudspeaker 40, with the fifth transducer 50 generating sounds of lower pitch.

The modification branches of the directional tone color component 64 each have a signal delay device (66, 68, 70, 72) and attenuated feedback (74, 76, 78, 80). The fifth modification branch 62 contains a low pass filter 82. This branch 62 is provided in order to compensate for a distinct loss of bass when the loudspeaker system 40 is composed solely of the transducers of the directional tone color component 64 operating at higher frequencies.

At high frequencies, if the phases of the high frequency transducers cancel so that there is no radiation in the forward direction, there will be radiation in some other direction due to the extra path differences when sound is heard from an angle. This is the essence of the directional tone loudspeaker. However, at low frequencies, where the wavelength is long, it is impossible to get an extra half wavelength by going off at an angle because the speakers are too close together, therefore, the bass frequencies are lacking. In view of this, the fifth transducer 50 and corresponding modification branch 62 were added to correct for the bass deficiency.

This fifth transducer 50 is a low frequency transducer or woofer which generates sounds of lower pitch, generally corresponding to lower frequencies. (This embodiment provided the woofer with frequencies below 900 Hz, however this division of the frequency spectrum can vary widely.) The sound produced by the woofer is generated based upon frequencies passed by the low pass filter 82. In order to ensure that the directional tone color transducers (42, 44, 46, 48) do not interfere with the woofer, the input signal 52 is passed through a high pass filter 84 prior to alteration by the modification branches of the directional tone color component.

As previously indicated, each transducer of the directional tone color component 64 is provided a signal from a modification branch. Each modification branch alters the signal as provided by the high pass filter 84. Each alteration consists of a different phase delay, dictated by each of the individual signal delay elements (66, 68, 70, 72). For example, in one configuration, the phase delay for the first signal delay element 66 was chosen to be 20 ms, which corresponds to the 50 Hz average spacing between resonances of a violin. The phase delay for the second signal delay element 68 was set to 12 ms, with the third signal delay element 70 set to 6 ms, and the fourth signal delay element set to 3 ms. This variation in phase for each of the sounds produced by the directional tone color transducers simulates an irregular periodicity as the frequency increases. It should be noted that the values are presented for illustrative purposes only, and that smaller or larger time delays may be used.

Each modification branch (54, 56, 58, 60) also has an attenuated feed back loop (74, 76, 78, 80) which sends some of the delayed signal back to the delay input of the signal delay elements (66, 68, 70, 72). With the addition of the attenuated feedback loops there is introduced a delay, secondary delay, tertiary delay, etc., which rapidly decays. Therefore, each directional tone color transducer (42, 44, 46, 48) receives an audio input as a decaying reverberant signal, thereby providing additional complexity to the radiating sound pattern of the directional tone color loudspeaker.

Figure 4:
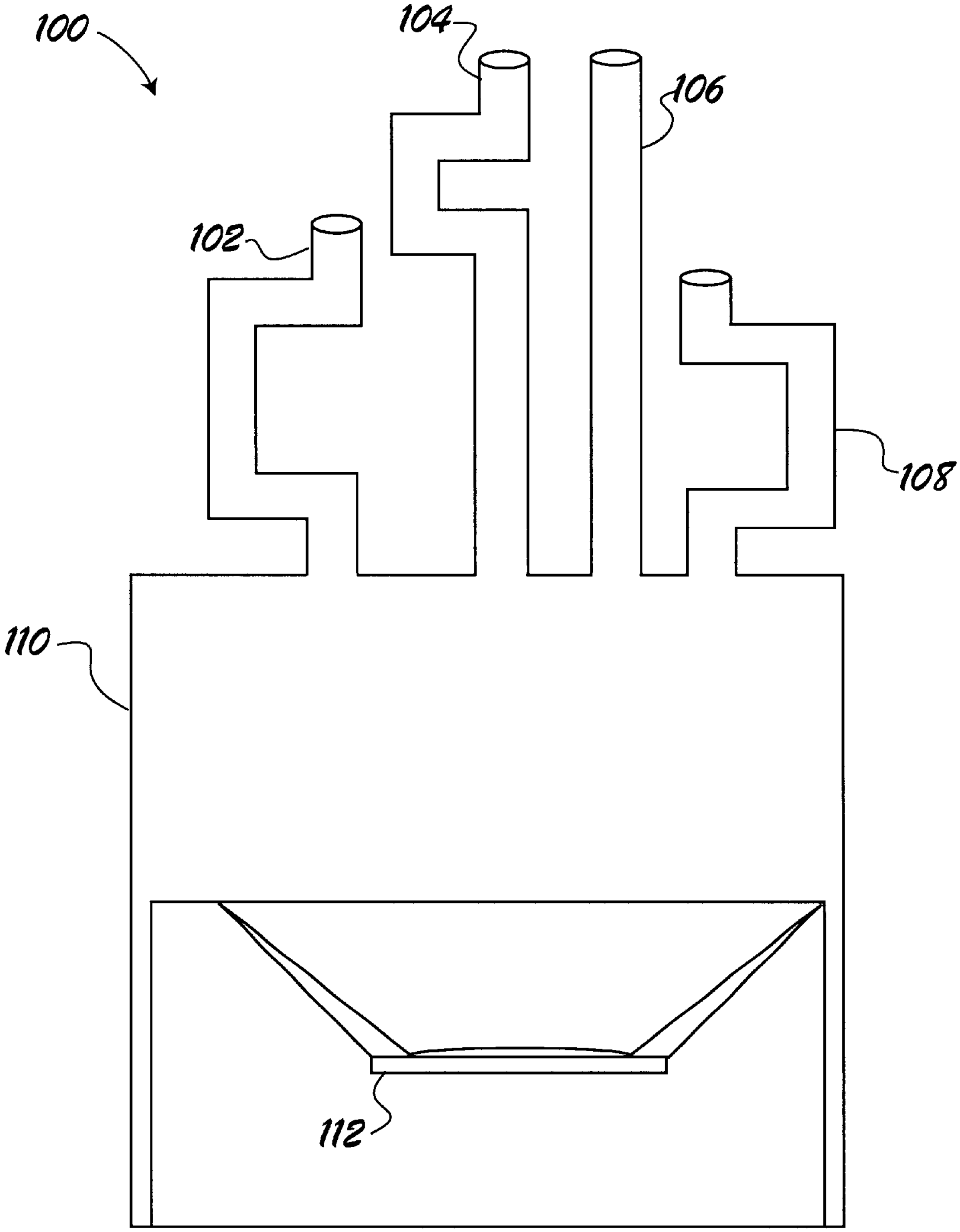
FIG. 4 is an illustration of an alternate embodiment of the directional tone color loudspeaker of the present invention.

FIG. 4 illustrates an alternate embodiment of the present invention. The principle of construction of this directional tone color loudspeaker system 100 is that sound emerges from a number of different pipes, in this illustration four pipes (102, 104, 106, 108), which are all connected at their input end to a single enclosure 110 housing a traditional loudspeaker driver 112. Each pipe (102, 104, 106, 108) has a length in the order of a few feet, so that within the audio range the internal resonances give the sound a highly variable frequency response. Moreover, the different pipes have different, and more or less unrelated lengths, making the composite frequency response almost random. The pipes are mounted so that their output ends are located irregularly and eight or so inches apart. The result is that the constructive and destructive interference among the sound waves produced by the individual pipes create the complex and rapidly varying directional pattern.

These directional tone color loudspeakers generate the complex and widely varied radiation patterns which results in a surprising realism. The inter-sound source spacings and delay times cooperate to produce a desired radiation that varied both in direction and frequency. The individual sources establish individual sound fields that interact constructively and destructively to produce the time-varying patterns.

It is worth pointing out that the results of the directional tone color loudspeakers, as presented, fly in the face of conventional wisdom which is dominant in the loudspeaker field for close to a century. This conventional wisdom provides that one of the attributes of the ideal loudspeaker is to have a frequency response which is perfectly "flat." In fact, there is absolutely no reason for such criterion, since no room is "flat" in its frequency response. In addition, it makes little sense to evaluate a speaker as though the space in which it will be used does not exist.

Various other advantages of the present invention will become apparent to those skilled in the art after having the benefit of studying the foregoing text and drawings, taken in conjunction with the following claims.

Theory and Experimental Results

Abstract

Above about 1 kHz, the angular radiation pattern of a violin begins to vary rapidly not only with direction but also with frequency, typically changing drastically from one semitone to the next. In an enclosed space, this characteristic, which we have named "directional tone color", can produce the illusion that each note played by a solo violin comes from a different direction, endowing fast passages with a special flashing brilliance. It also has important consequences for the perception of vibrato, for the difference in sound between a solo violin and an orchestral section playing in unison, for the mysterious quality called "projection," and for the problem of reproducing violin sounds through a loudspeaker. This paper introduces the theoretical basis of directional tone color, presents data to support its existence, and discusses the various ways in which it can be musically important.

I: Theory

Except at the lowest frequencies, a violin radiates sound primarily through the vibration of its wooden shell. (It has been suggested that air modes may possibly again become important at very high frequencies, where their density becomes larger than that of wood modes; but that would, in any case, not greatly affect the argument of this paper. See G. Weinreich, "Sound radiation from boxes with tone holes," *J. Acoust Soc. Am.* 99, 2502 (1996) (A).) Accordingly, we begin by discussing the nature of the modes of such a shell.

I. A Density of Wood Modes in Frequency

If the elastic properties of the shell were isotropic, the frequency density of wood modes would be easy to compute. See L. Cremer, *The Physics of the Violin,* J. S. Allen, Trans., Cambridge, Mass., The MIT Press, 1984, pp. 284–292. First, we note that the density of such modes in the k-plane is approximately constant and equal to $A/(2\pi)^2$, where A is the area of the shell. Second, we relate the absolute value of k to the frequency of a bending wave, which is proportional to $k^2$; hence, the area of the circle in the k-plane containing modes up to a certain frequency is proportional to that frequency. Third, by multiplying this area by the density of modes, we obtain the total number of modes with frequencies up to any specified value; it, too, is proportional to the maximum frequency. Finally, the amount by which the maximum frequency changes when the number of modes is incremented by one is the average spacing Δf between them. The foregoing argument shows that it is constant; a simple calculation gives its value as $$\Delta f = ac_w/A\sqrt{3}, \quad (1)$$

where $c_w$ is the speed of compressional waves in the wood, and a the thickness of the shell.

Unfortunately, the problem is made very much more complicated by the anisotropy of the wood. Not only are the speeds of compressional waves drastically different along and across the grain, but the effective Young's modulus for compressions in a direction making an angle a with the grain of the wood can be shown to have the form $$Y(\alpha) = L\cos^4\alpha + 2M\cos^2\alpha\sin^2\alpha + N\sin^4\alpha, \quad (2)$$

where L, M, N are three independent elastic constants. We see from this that the wave speeds in two mutually perpendicular directions still do not provide a sufficient specification of everything that we need to know. Further serious complications are introduced by the arching of the plates.

On the other hand, the fact that the average spacing of modes approaches constancy at high frequencies remains true even in these more complicated cases. We follow Cremer in estimating it by replacing $c_w$ in equation (1) with the mean proportional of the wave speeds in the two principal directions, resulting in values of Δf of 73 Hz for the top plate and 108 Hz for the back plate; the two then combine to give an overall average spacing for the instrument of about 44 Hz.

It should not, of course, be surprising that the fundamental mode of the violin shell is considerably higher, in the vicinity of 500 Hz. Apart from the fact that in this context it makes little sense to combine together the densities of top and back, the main reason for the discrepancy has to do with the nature of the boundary conditions. As is well known, the fourth-order equation which governs bending modes has both oscillatory and exponential solutions, with the characteristic distances (wavelength for the first case, decay distance for the second) approximately equal to each other. Obviously, the exponential solutions will, depending on the exact nature of the boundary conditions, be important around the edges of the shell, covering a region the approximate width of a wavelength, and making the latter shorter than the size of the shell would naively lead one to expect. This correction becomes progressively less important for higher modes whose wavelengths become short compared to the size of the shell, but can easily account for a factor of two or more in the wavelength of the fundamental, which corresponds to a factor of four or more in frequency. As a result, it would not be at all surprising to find the fundamental frequency of the top plate at about 300 Hz instead of 73. This is further raised (presumably, to the observed 500 Hz) by the shape of the plate, which tends to confine the fundamental mode to the lower bout.

I.B: Distribution of Radiation from a Shell Mode

In general, the angular distribution of radiation from a radiating system, or "antenna," is governed above all by the relation of the size of the antenna to the radiated wavelength $\lambda$, or rather to $\bar{\lambda}=\lambda/2\pi$. If the antenna is much smaller than $\bar{\lambda}$, the details of its structure become unimportant. The radiated sound is then isotropic, and its amplitude is determined by the next amplitude of pulsating volume, with parts of the surface that move outwards being compensated by others which, at the same moment, move inwards. (An exception occurs if the net pulsating volume is zero. This happens for a violin at very low frequencies, an effect that we shall mention again in section II.G. See G. Weinreich, "Sound hole sum rule and the dipole moment of the violin," *J. Acoust. Soc. Am.* 77, pp. 710–718 (1985).

If, on the contrary, the antenna is large, individual regions whose size is approximately $\bar{\lambda}$ will radiate more or less independently, producing "beams" which do, however, spread out with distance and hence interfere with each other, somewhat the way that the two slits in a double-slit diffraction experiment do. The result is an angular distribution of radiation which becomes progressively more complex with increasing number of independently radiating regions.

To estimate the frequency at which a violin might be expected to pass from the "small antenna" to the "large antenna" regime, we note that for a spherical radiator this transition occurs when its radius is equal to $\bar{\lambda}$. Taking the "radius" of a violin to be 7 cm, we then obtain a transition frequency of approximately 800 Hz. (We use a rather small value of radius, corresponding to a path that connects top and back via the C-bouts, since that is where the "short-circuiting" which defines the long-wavelength regime will first occur.) Accordingly, we expect the radiation of a violin to be roughly isotropic below 800 Hz, becoming progressively more anisotropic above.

The next question is: To what degree, and beginning at what frequency, does the detailed pattern of a shell mode affect the directional distribution of radiation? In other words, are the sizes of the regions that move independently sufficiently large compared to an air wavelength to be individually effective? Now in the case of a rigid piston, it is known that the answer to this question depends on the ratio of the size of the piston to $\bar{\lambda}$ in air. If we apply the same criterion to the violin, substituting half a wavelength of the bending wave for the size of the "piston", we obtain as the corresponding transition frequency $f_c/\pi^2$, where $f_c$ is the so-called coincidence frequency, the frequency at which the wavelength of a bending wave is equal to the wavelength of an air wave. For the violin top, for example, Cremer estimates $f_c$ as 4.87 kHz for waves along the grain and 18.42 kHz for waves perpendicular to it, which would give us transition frequencies of about 500 Hz and 2 kHz, respectively. Without attempting too detailed an interpretation, it is clear that the individual modes are apt to influence the radiation pattern at all frequencies that are of interest to us.

I.C Excitation of Individual Modes

A driving force of a certain frequency, such as is provided by a steadily bowed string, will in principal put each mode of the violin into vibration; quantitatively, however, this excitation will be appreciable only for modes whose normal frequency is within a resonance width of a strong Fourier component of the driving signal. It is not always easy to determine, by simple inspection of radiativity curves, whether the individual peaks and valleys of the response are produced by single modes or by statistical combinations of many; knowing, however, that the modes have an average spacing of around 45 Hz, it will become clear that the observed peaks correspond either to single modes or, at most, to combinations of a small number of them (see section II.H). Accordingly, we would expect the angular pattern of violin radiation, once it begins to change at all, to change fairly drastically every 50 Hz or so.

II. Experiment

All of our measurements are based on the principle of reciprocity, which relates the outgoing acoustic field radiated per unit transverse force on the bridge (the radiativity) to the motion of the bridge that results from a corresponding incoming unit acoustic field applied to the violin. In the original application of the principle to violin physics, it was desired to obtain the radiativity as an expansion in multipole moments, which required the angular dependent of the corresponding incoming fields to have a controlled multipole nature as well. (See G. Weinreich, "Sound hole sum rule and the dipole moment of the violin," *J. Acoust. Soc. Am.* 77, pp. 710–718 (1985)). In the present work, the situation is conceptually much simpler: in order to measure the radiativity for outgoing waves in a particular direction, we need to expose the violin to an incoming plane wave from the same direction, and normalize the signal by the pressure amplitude as measured by a microphone in the same location as the violin is going to be.

Since our aim is to search for strong directional dependence, we have arbitrarily chosen two directions in which to compare the radiativity, namely (1) more or less normal to the top plate of the violin, and (2) outward in the direction of the neck.

II.A Transducers and Electronics

The two necessary stimulus waves are generated by a pair of identical JBL model 4408 loudspeakers placed in our quasi-anechoic chamber, which is an approximately rectangular space 10×12×10 ft high fully lined with 4-inch Sonex.

The velocity of the violin bridge is sensed by a standard magnetic phonograph pickup whose stylus rests on the bridge halfway between the D and A notches. The violin is held in a horizontal position by a wooden frame which is in turn suspended from the ceiling of the chamber by three metal chains. The phonograph pickup is mounted on a "tone arm" which rests on a knife edge attached to the frame so as to allow it to pivot freely around a horizontal axis, maintaining the stylus at the correct vertical force. This force is adjusted by a counterweight attached to the arm.

The normalizing signal is measured by an inexpensive electret microphone at the end of a thin boom which is introduced when the violin is removed; it, too, then occupies what would otherwise be the midpoint between D and A notches of the bridge. (The choice of microphone position is discussed in section II.C).

The speakers are driven by a signal comprised of a repetitive series of 8192 digital values generated at a 50 kHz sampling rate by the 12-bit D/A converter of a data Translation DT 2821 board controlled by a Pentium 100 MHz desk computer. It has the form of a Schroeder chirp that covers the range from 122 Hz to 24.4 kHz in steps of 6.2 Hz. (See M. Schroeder, "Synthesis of low peak factor signals and binary signals with low autocorrelation," *IEEE Transactions on Information Theory* 16, 85–89 (1970)). In synchronism with it, the 12-bit A/D converter of the same board receives the response signal, accumulating the sum of 16 passes after first allowing four passes (about two-thirds of a second) for the violin to reach steady state.

The driving voltage is filtered by an 8-pole Butterworth anti-alias filter with an 18 kHz cutoff before being applied to the voice coil of the appropriate speaker by a Crown D-150 power amplifier. The return signal—whether from the phonograph pickup or the microphone—is amplified by a low-noise preamplifier before leaving the chamber, and enters the A/D input of the DT2821 after being filtered by a second identical anti-alias filter.

II.B Frequency Limitations

Even though the computer-generated driving signals can easily cover a range of 18 kHz or more, the properties of our system are such as to make the data at very high frequencies undependable. The chief limitations come from (a) the phonograph pickup and the properties of the tone arm, whose own resonances appear clearly in the high-frequency data, especially when stylus motion is examined in the vertical direction; (b) direct electromagnetic coupling between the speaker cable and the cable that connects the magnetic pickup to the preamplifier, where the signal level is very low.

Although it is possible to address these factors, we decided that, for an investigation whose basic aim is the demonstration of directional tone color, it is sufficient to limit ourselves to the region up to 5 kHz, where (to the best of our knowledge) the data is dependable as is.

II.C. Choice of Microphone Position

In order to obtain a valid measurement of radiativity, the complex velocity of the bridge must, at each frequency, be divided by the complex pressure amplitude of the incoming wave. Now it is, of course, a property of a pure traveling plane wave that its amplitude has the same value regardless of where it is measured, only the phase changing as a function of position. Therefore, a displacement of the microphone that provides the normalizing signal would merely change the phase of the measured radiativity; in other words, the choice of microphone position corresponds simply to a choice of origin with respect to which the radiativity will finally be specified. As explained in section II.A, we chose this origin to be, for simplicity, at the same place where the bridge velocity will be measured, but in fact it could just as well be anywhere else (though it is, naturally, important to keep it consistent between measurements).

Of course the situation changes if, as must be true in real life, the incoming signal is not a pure traveling plane wave. Accordingly, we cannot interpret our results before carefully examining our stimulus waves.

II.D Characterization of the Stimulus Waves

In order to test the degree to which sound waves generated by the speakers in our chamber conform to the above requirements, we compared the two complex amplitudes received from a given speaker when the microphone is displaced a few inches in a direction away from the speaker. As indicated in the previous section, (a) the magnitude of this ratio should be unity independent of frequency, and (b) its phase should be linear in frequency, changing by $2\pi$ when the frequency increases by $c/\Delta L$, where $\Delta L$ is the displacement and c the speed of sound.

Figure 5:
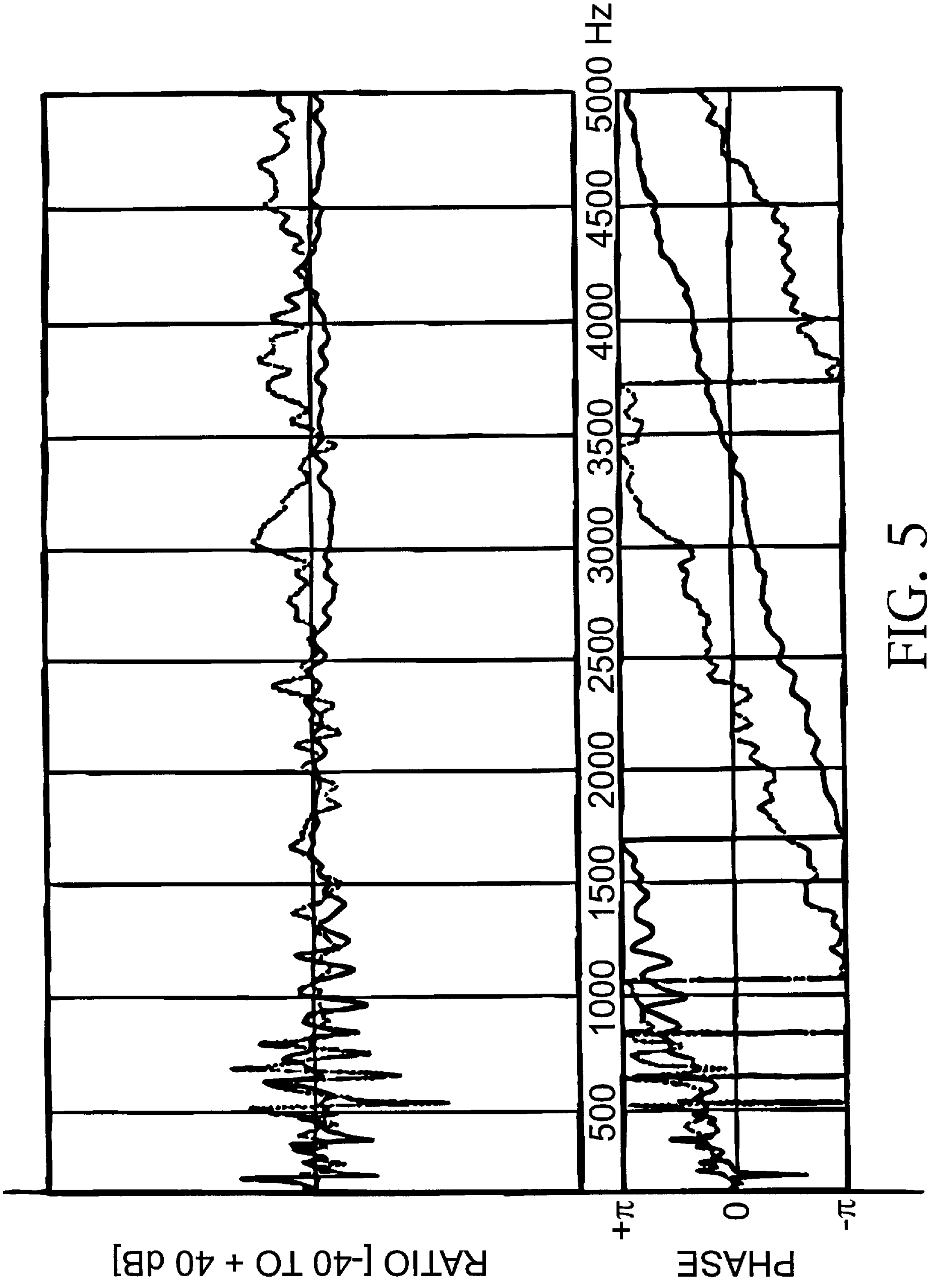
FIG. 5 is an graph showing the complex ratio by which a microphone's signal is multiplied when moved away from a speaker.

FIG. 5 shows the experimental value of this ratio plotted for each of the two speakers. It is clear that although the overall behavior resembles what is expected, deviations of a few dB do exist, indicating the presence of residual reflections; under such circumstances, our experimentally deduced radiativity in a particular direction will contain a coherent admixture of the radiativity in the reflected direction. We discuss the implications of this separately for the regions below and about 1 kHz.

Above 1 kHz, the directivity data is, as discuss in section I.C, expected to vary rapidly with frequency by considerably larger amounts, and on a finer frequency scale, than the driving signals of FIG. 5, an expectation which will be born out by our results (section II.F). So long as our purpose is to establish the existence of strong directional tone color, rather than investigate its precise fine details, a small amount of directional mixing is not important.

Below 1 kHz, the deviation from wave purity shown in FIG. 5 becomes worse, which is not surprising in view of the decreasing absorptivity of Sonex in this range. On the other hand, our expectation is, as discussed in section I.B, to see a more or less isotropic radiativity here; this expectation, too, will be born out by our data. But if the radiativity is truly the same in all directions, then the admixture of two directions should in principle make no difference regardless of how large it is.

We conclude that, in either frequency region, the stimulus signals produced by our two speakers are sufficiently close to pure traveling waves for the purposes of this investigation.

II.E Results for the Radiativity

As already indicated, our aim in the present work is to compare the radiativities of a violin in two arbitrarily chosen directions, by first obtaining the response of the bridge stylus to signals from each of the loudspeakers, then dividing by the microphone signal from the same speaker. Of course the data consists, after Fourier transformation, of a complex amplitude for each of 4096 frequencies, so that "dividing one signal by another" means performing one complex division at each frequency.

Figure 6:
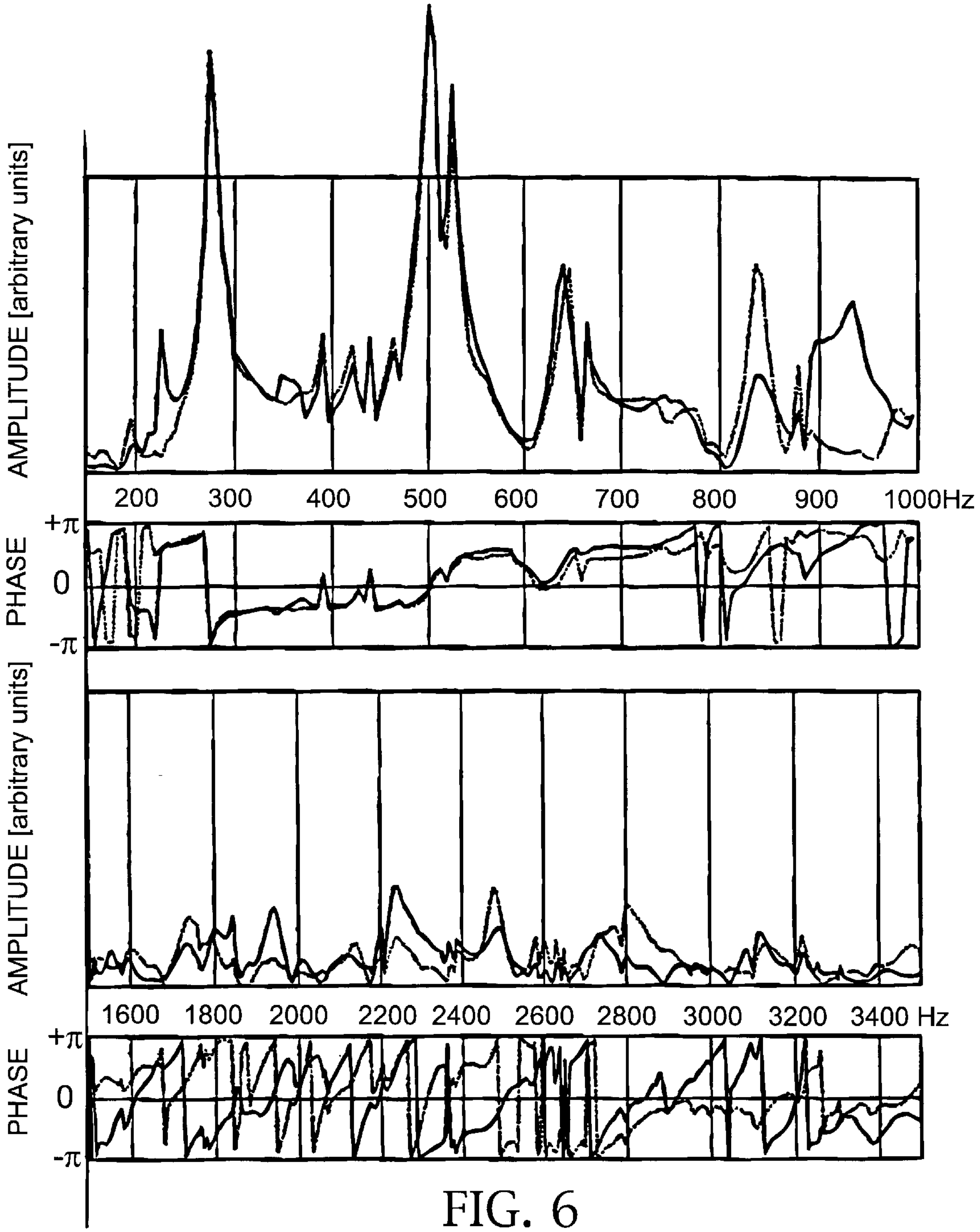
FIG. 6 is a graph showing two frequency ranges of the radiativity amplitude and phase of a violin measured in two directions.

FIG. 6 shows a comparison of the two radiativities so obtained for two frequency ranges: 150 1000 Hz (top) and 1500 to 3500 Hz (bottom). It will be seen from the top graph that, except for an unusual feature at about 230 Hz to be discussed in section II.G, the radiativities are pretty much the same up to about 800 Hz, in agreement with our expectations of isotropy (section I.B).

The situation is, however, radically different at higher frequencies, as shown in the bottom graph of FIG. 6. We note that the frequency placement of peaks and valleys which characterize the radiativities in the two directions are very similar—which is, of course, exactly what one would expect, since the same normal modes are represented in both cases. The magnitudes and phases of the two curves are, however, quite different from each, and that in a completely irregular manner—again in agreement with our theoretical discussion.

II.F Results for the Directivity

Figure 7:
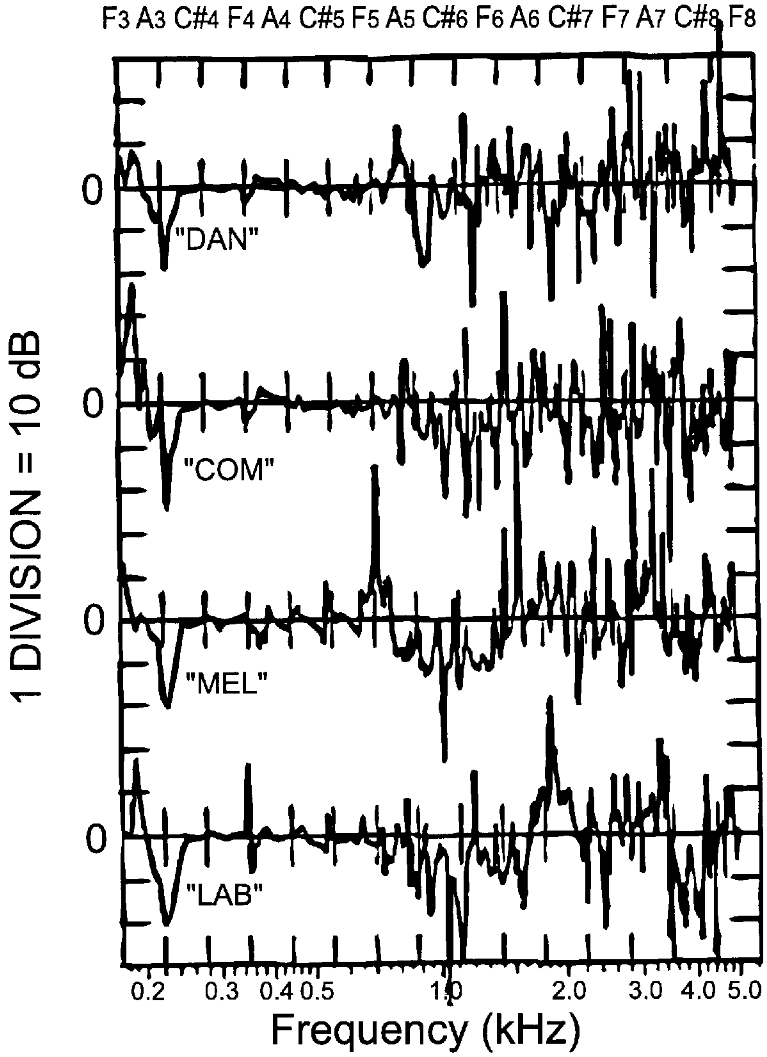
FIG. 7 is a graph showing the comparative ratios of radiativity in two directions for four violins.

In order to display the directivity of the violin, we divide the radiativity along the neck ("direction 2") by that perpendicular to the top plate ("direction 1"). FIG. 7 shows the results of performing this division for four separate violins, plotted on a log-long scale, and omitting the phase to simplify the graphs. Here the ratio is specified in decibels where, of course, 0 dB denotes isotropy (at least with regard to the two chosen directions), and positive values mean that the radiativity in "direction 2" exceeds the one in "direction 1." The four graphs are offset vertically for clarity.

The frequency axis in FIG. 7 is also logarithmic, so that equal horizontal displacements mean equal musical intervals. In fact, this axis is labeled, in addition to the logarithmic frequency scale at the bottom, with steps of one-third octave, or four semitones, at the top, using the conventional musical notation in which $A_4$ corresponds to a frequency of 440 Hz. We observe the following features in all four graphs:

(a) Except for the peculiar phenomenon around A3, all four violins exhibit a fair degree of isotropy up to about $A_5$, as expected.

(b) Above that frequency, the patterns become wildly irregular, jumping up and down by amounts that sometimes exceed 40 dB peak-to-peak; this is, of course, precisely the quality of "directional tone color" that we defined at the beginning of the paper. We also note that, as expected from the discussion of section I.C, the spacing of these peaks and valleys is in the vicinity of one semitone where they first begin, becoming progressively finer as the frequency rises.

II.G The Feature Around Low A

As indicated in section II.D, the stimulus signals tend to deviate appreciably from pure traveling waves below about 1 kHz. Although this makes it difficult to interpret anisotropy data in detail in that band, it is nonetheless true, as we mentioned there, that if the radiativity were truly isotropic such a deviation ought not to make any difference. Accordingly, even if a quantitative characterization is risky, one may state with some assurance that below about 250 Hz the radiativity of our violins again begins to deviate from isotropy. Indeed, the patterns in which they do so are rather similar (though by no means identical) for the four instruments.

In fact, this behavior appears precisely in the frequency region where the dipole moment of the violin beings to dominate. (See G. Weinreich, "Sound hole sum rule and the dipole moment of the violin," *J. Acoust Soc. Am.* 77, pp. 710–718 (1985)). That is, in our opinion, the most probable reason for the low-frequency anisotropy, which seems otherwise difficult to explain.

II.H To What Degree do the Modes Overlap?

Figure 8:
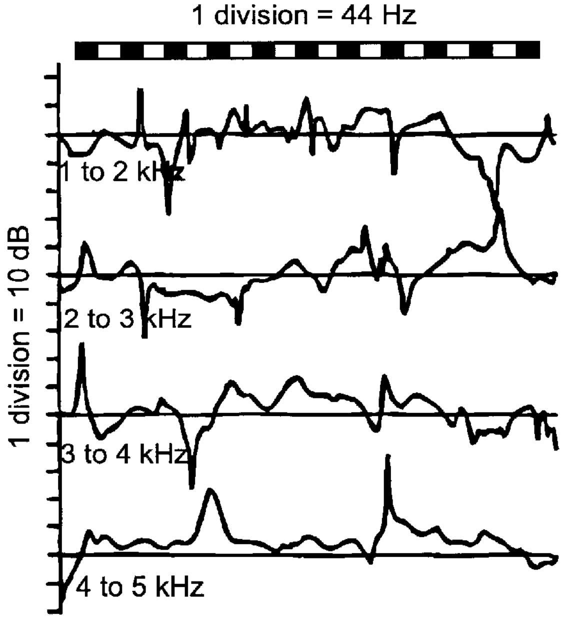
FIG. 8 is a graph showing the comparative ratios of radiativity in two directions for a violin plotted against linear frequency.

FIG. 8 repeats, for one of the violins ("DAN"), the same directional characteristic already shown in FIG. 7; this time, however, the frequency axis is linear instead of logarithmic, and the region from 1 to 5 kHz is stretched out into four sections so as to make its details more visible. For reference, we also show, at the top of the diagram, a scale whose divisions are 44 Hz, equal to the estimated average spacing of wood modes (section I.A). It appears that the first range of the graph, from 1 to 2 kHz, has a structure whose frequency scale is reasonably well described by this estimate; but the directivity becomes successively more "washed out" as we go toward higher frequencies (though not on a logarithmic scale!).

The most likely explanation of this behavior is, of course, that in the range of a few kHz the damping of modes increases so that they begin to overlap each other. It should be noted, however, that there may well be an additional factor contributing to this effect, namely the gradual appearance of air modes, whose density will be approaching that of the wood modes in the same approximate region. See G. Weinreich, "Sound radiation from boxes with tone holes," *J. Acoust. Soc. Am.* 99, 2502 (1996) (A).

III: Discussion

The phrase "directional tone color" in the sense of this paper was first introduced in 1993. See G. Weinreich, "Radiativity revisited: theory and experiment ten years later," in Friberg et al., Eds. *SMAC* 93: *Proceedings of the Stockholm Music Acoustics Conference,* Stockholm, Royal Swedish Academy of Music, 1994, p. 436. In this section we outline some of its consequences for the world of musical performance.

III.A "Flashing Brilliance"

This phrase, also first introduced in G. Weinreich, "Radiativity revisited: theory and experiment ten years later," in Friberg et al, Eds. *SMAC* 93: *Proceedings of the Stockholm Music Acoustics Conference,* Stockholm, Royal Swedish Academy of Music, 1994, p. 436, describes the fact that, in an enclosed space large enough for the ear to perceive the timing of separate reflections and, hence, support a strong directional sense, the way that the radiation pattern of a violin changes drastically from one semitone to the next can result in an illusion that each note is coming from a different direction. This effect will be made even richer if the violin's angular orientation changes with time, a fact that may explain the common habit of violinists of never standing still (or, in the case of chamber musicians, never sitting still)—unlike wind players who, as a rule, tend to maintain a much more constant position.

The perception of "flashing brilliance" is made especially complex (and, we suspect, especially brilliant) by the fact that different harmonics appear to come from different directions. It should be noted here that, according to the discussion of sections I.B and II.F, the effect we are talking about will be strong beginning for all partials of most notes played on the E-string; but even for the lowest notes of the G-string it will be present beginning with about the fourth partial.

III.B Vibrato

As discussed in detail by Meyer, vibrato on a violin—executed by a motion of the left wrist that causes the fingertip to roll forward and back on the fingerboard, thus causing an oscillatory variation of the string length—is reflected not only in frequency modulation but also in amplitude modulation of the played note, because of the way that the normal frequency of the string moves with respect to the peaks and valleys that characterize the instrument's radiativity. See J. Meyer, "Zur klanglichen Wirkung des Streicher-Vibratos," *Acustica* 76, 283–291 (1992). Since the frequency range covered by a typical vibrato can easily exceed a semitone, we now see that the result will be a strong modulation of the directional radiation pattern as well.

The effect can be visualized in terms of a number of highly directional sound beacons, all of which the vibrato causes to undulate back and forth in a coherent and highly organized fashion. It is obvious that such a phenomenon will help immensely in fusing sounds of the differently directed partials into a single auditory stream; one may even speculate that it is a reason why vibrato is used so universally by violinists—as compared to wind players, from the sound of whose instruments directional tone color is, of course, absent.

III.C Solo Versus Tutti

Although various explanations have been given of the striking way in which a solo violin can be clearly head above an orchestra even when the latter contains two dozen violins playing at more or less the same dynamic level, directional tone color may well, in fact, be the major factor contributing to this phenomenon. See for example J. Backus, *The Acoustical Foundations of Music,* 2nd ed., New York, W. W. Norton & Co., 1977. The point is, of course, that even though the presence of large and closely spaced variations in the instrument's directivity, which is what "directional tone color" means, appears to be characteristic of every instrument, the exact placement of these maxima and minima has no detailed correlation between different violins. As a result, the process of summing a number of them will strongly diminish the variability of the total.

Figure 9:
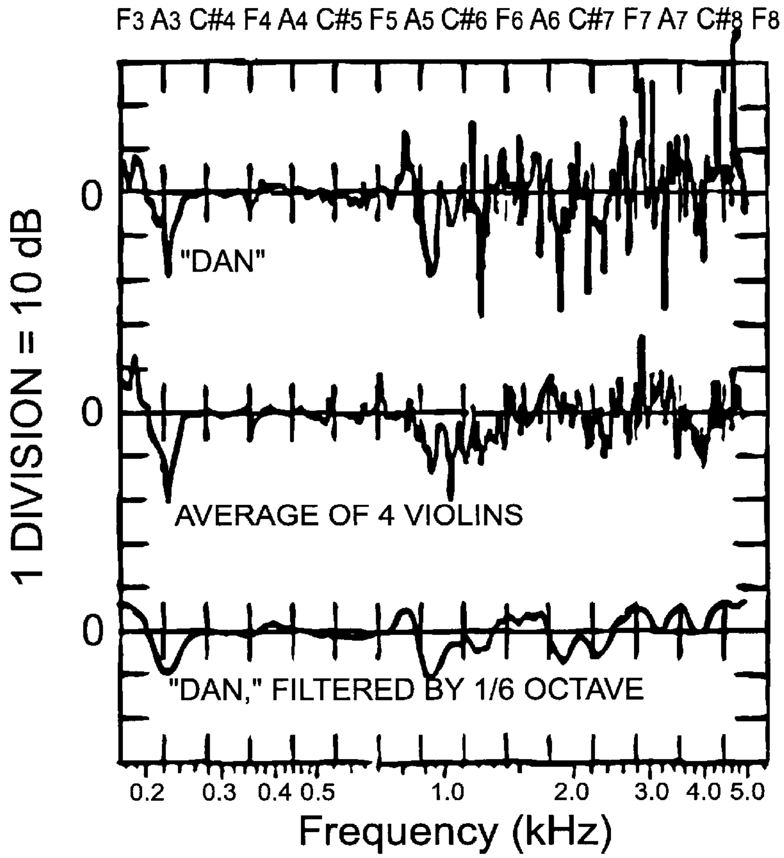
FIG. 9 is a graph showing the directivity amplitude of a violin, average of directivity amplitudes of the four violins, and directivity amplitude of the single violin when filtered through a one-sixth octave filter.

This effect is demonstrated in FIG. 9, which shows three different directivity curves. On top, we repeat the characteristic for one of the violins ("DAN") that was already shown in FIG. 7; in the middle, the average of all four of our violins is plotted; and finally, the bottom curve shows the one for "DAN" filtered through a one-sixth octave filter, which might be considered a reasonable estimate for what happens when ten or twelve violins are playing together. It is clear that averaging as few as four violins diminishes the directional tone color drastically, while the one-sixth octave filter essentially eliminates it entirely. Under such circumstances it is not surprising that a single solo violin, with a good vibrato to consolidate its auditory stream, can musically soar with ease above its orchestral environment.

Figure 10:
FIG. 10 is the opening of the fourth movement of Tchaikovsky's Sixth Symphony for string parts.

In this connection it is interesting to note a curious situation that occurs in the fourth movement of the Sixth Symphony of Tchaikovsky, the score of the first few measures of which (string parts only) is shown in FIG. 10. In this case the theme has its notes alternating between the first and second violins, the next note by the first violins, and so on (a similar alternation appears in the two lower parts as well). Remembering that the normal way for an orchestra to be seated was, at that time, to have the first violins at the left of the stage and the second violins at the right, such an orchestration results in alternate notes of the same theme coming from radically different directions. It is hard to avoid the speculation that Tchaikovsky, unconsciously to be sure, chose this unusual voice leading in order to give the violin sections a kind of artificial directional tone color, thus endowing a tutti passage with some of the tonal quality of solo instruments.

III.D "Projection"

Violinists place an attribute which they call "projection" of an instrument high on their list of desirable qualities; it seems to refer to an ability for its sound to fill a hall, though its adherents will emphasize that this does not just mean generating a lot of power, but something rather different. If one tries to paraphrase such a quasi-definition by saying that "projection" refers not so much to the ability to permeate an auditorium with decibels as to command attention from listeners in various parts of it, then the physical quality of directional tone color immediately comes to mind. It might be, for example, that for a given instrument there are bands in which the variation of directivity is relatively weak or relatively slow, in which case that instrument might be observed to "lack projection" for frequencies that have important harmonic content in those bands. We emphasize that this hypothesis is, at the present moment, entirely speculative.

III.E Electronic Reproduction

Pierre Boulez has observed (See "Le haut-parleur anonymize la source rèelle.", P. Boulez, *Proc. 11th International Congress on Acoustics,* Paris, 8, 216 (1983)) that loudspeakers have the property of "anonymizing" the sound of musical instruments, that is, of making them all sound the same. Given the superb objective specifications of good modern loudspeakers, it is hard to put physical meaning to such a statement in terms of qualities such as frequency response or distortion. Yet there is one attribute of a loudspeaker which it does, indeed, impose upon all sounds that it generates, and that is its own directivity. Specifically, when music is played through a loudspeaker the quality of directional tone color is instantly and totally obliterated.

The damage is, perhaps, not excessively serious for wind instruments, and especially for the brasses, whose live sound is projected through a circular bell of a size not too radically different from that of a typical loudspeaker. As a result, the directional properties of this sound, essentially those of a circular piston of comparable diameter, remain—by coincidence, to be sure—relatively faithful. But when violin music undergoes the same process, the result is similar to what one would hear if the violinist were on the other side of a solid wall in which a circular hole the size of the speaker had been cut: none of the effects that we have enumerated in sections III.A–III.D can any longer occur.

Indeed, a number of music lovers with whom the author has spoken are of the opinion that separating the sound of a solo violin from an accompanying orchestra is much easier to do in a concert hall than when listening to a recording—though others strongly disagree. Unfortunately, the question is complicated on the one hand by the presence of visual cues in a live performance, and on the other by the ability of recording engineers to enhance whatever part they wish to emphasize.

What is claimed is:

1. A Directional Tonal Color Loudspeaker for simulating a complex audio radiation pattern, comprising:

a plurality of electroacoustic transducers disposed in proximity to one another; and a plurality of signal modification devices receiving an audio signal and producing a plurality of modified signals having varying phase delays, said plurality of modified signals provided to said plurality of electroacoustic transducers which generate a plurality of sound waves that constructively and destructively interact to simulate the angular radiation pattern of instruments;

wherein said signal modification devices produce said varying phase delays by delaying said sound waves relative to said audio signal by a plurality of different delay amounts, at least one of which delay amounts is less than twenty milliseconds.

2. The Directional Tone Color Loudspeaker of claim 1 further comprising attenuated feedback of said plurality of modified signals such that decaying reverberant signals are provided to said plurality of electroacoustic transducers which introduces additional complexity to said complex audio radiation pattern.

3. The Directional Tone Color Loudspeaker of claim 1 further comprising a low frequency transducer that is supplied said audio signal without delay.

4. The Directional Tone Color Loudspeaker of claim 3 wherein said audio signal is provided to a low pass filter for filtering prior to being supplied to said low frequency transducer.

5. The Directional Tone Color Loudspeaker of claim 1 wherein said audio signal is provided to a high pass filter for filtering prior to being modified by said plurality of modification devices.

6. The Directional Tone Color Loudspeaker of claim 1 wherein four electroacoustic transducers are disposed in close proximity to one another.

7. The Directional Tone Color Loudspeaker of claim 1 wherein five electroacoustic transducers are disposed in close proximity to one another.

8. The Directional Tone Color Loudspeaker of claim 1 wherein said complex audio radiation pattern is simulating sound originally produced by a single source.

9. The Directional Tone Color Loudspeaker of claim 1 wherein said complex audio radiation pattern is simulating sound originally produced by a sound source which generates different notes at different locations.

10. A method for simulating a complex audio radiation pattern, comprising the step of:

(a) receiving an audio signal;

(b) dividing said audio signal into a plurality of audio frequency bands;

(c) altering the phase of each of said plurality of audio frequency bands by delaying said audio frequency bands by a plurality of different delay amounts, at least one of which delay amounts is less than twenty milliseconds in order to produce a plurality of modified audio frequency bands; and (d) generating a plurality of sound waves with said plurality of modified audio frequency bands using a plurality of audio sources disposed in close proximity to one another such that constructive and destructive interaction of said sound waves simulate the angular radiation pattern of instruments.

11. The method for simulating a complex audio radiation pattern of claim 10, further comprising the step attenuating said plurality of modified audio signals.

12. The method of simulating a complex audio radiation pattern of claim 10, further comprising the step of generating low frequency sounds with a low frequency transducer.

13. The method of simulating a complex audio radiation pattern of claim 10, further comprising the step of filtering the high frequency components of said audio signal.

14. The method of simulating a complex audio radiation pattern of claim 10, further comprising the step of filtering the low frequency components of said audio signal.

15. The method of simulating a complex audio radiation pattern of claim 10 wherein four audio sources are disposed in close proximity to one another.

16. The method of simulating a complex audio radiation pattern of claim 10 wherein five audio sources are disposed in close proximity to one another.

17. The method of simulating a complex audio radiation pattern of claim 10 wherein said complex audio radiation pattern is simulating sound originally produced by a single source.

18. The method of simulating a complex audio radiation pattern of claim 10 wherein said complex audio radiation pattern is simulating sound originally produced by a sound source which generates different notes at different locations.

* * * * *